United States Patent
Kitabayashi

(10) Patent No.: US 9,543,154 B2
(45) Date of Patent: Jan. 10, 2017

(54) METHOD FOR MANUFACTURING SEMICONDUCTOR DEVICE

(71) Applicant: Sumitomo Electric Industries, Ltd., Osaka-shi (JP)

(72) Inventor: Hiroyuki Kitabayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 52 days.

(21) Appl. No.: 13/890,893

(22) Filed: May 9, 2013

(65) Prior Publication Data

US 2014/0004696 A1    Jan. 2, 2014

Related U.S. Application Data

(60) Provisional application No. 61/665,770, filed on Jun. 28, 2012.

(30) Foreign Application Priority Data

Jun. 28, 2012    (JP) .................................. 2012-145080

(51) Int. Cl.
H01L 21/28    (2006.01)
H01L 21/04    (2006.01)
(Continued)

(52) U.S. Cl.
CPC ........... H01L 21/28 (2013.01); H01L 21/0485 (2013.01); H01L 21/6836 (2013.01);
(Continued)

(58) Field of Classification Search
CPC .................... H01L 29/41741; H01L 29/66666; H01L 29/7827; H01L 21/6836
See application file for complete search history.

(56) References Cited

U.S. PATENT DOCUMENTS 4,818,560 A * 4/1989 Ishihara .................. C23C 16/22
136/258
5,019,233 A * 5/1991 Blake et al. ............. 204/192.12
(Continued)

FOREIGN PATENT DOCUMENTS

JP    2003-347260 A    12/2003
JP    2004-186522 A    7/2004
(Continued)

OTHER PUBLICATIONS

Lee et al., 'Improvement of preferred orientation of NiAl/CrMn underlayers deposited on prebaked tape substrates,' 2002 Journal of Applied Physics, vol. 91, No. 10, pp. 8736-8738.*
(Continued)

*Primary Examiner* — Bryan Junge
(74) *Attorney, Agent, or Firm* — Venable LLP; Michael A. Sartori; Tamatane J. Aga

(57) ABSTRACT

A method for manufacturing a semiconductor device includes the following steps. A semiconductor substrate is prepared which has a first main surface and a second main surface opposite to each other. The semiconductor substrate is fixed on an adhesive tape at the first main surface. The semiconductor substrate fixed on the adhesive tape is placed in an accommodating chamber. While maintaining a temperature of the adhesive tape at 100° C. or more, a gas is exhausted from the accommodating chamber. After the step of exhausting the gas from the accommodating chamber, a temperature of the semiconductor substrate is reduced. After the step of reducing the temperature of the semiconductor substrate, an electrode is formed on a second main surface of the semiconductor substrate. In this way, there can be provided a method for manufacturing a semiconductor device so as to achieve reduced contact resistance between a semiconductor substrate and an electrode.

16 Claims, 10 Drawing Sheets

(51) Int. Cl.
*H01L 29/66* (2006.01)
*H01L 21/683* (2006.01)
*H01L 29/78* (2006.01)
*H01L 29/16* (2006.01)

(52) U.S. Cl.
CPC .... *H01L 29/66068* (2013.01); *H01L 29/7802* (2013.01); *H01L 29/1608* (2013.01); *H01L 2221/6834* (2013.01); *H01L 2221/68327* (2013.01); *H01L 2221/68381* (2013.01)

(56) References Cited

U.S. PATENT DOCUMENTS

| | | | | |
|---|---|---|---|---|
| 5,952,086 | A | * | 9/1999 | Ohnishi et al. ............ 428/220 |
| 6,689,486 | B2 | * | 2/2004 | Ho et al. ............ 428/610 |
| 7,767,563 | B2 | * | 8/2010 | Li ............ 438/572 |
| 2007/0059878 | A1 | * | 3/2007 | Chang ............ H01L 21/28052 438/233 |
| 2008/0230911 | A1 | | 9/2008 | Li |
| 2010/0126415 | A1 | * | 5/2010 | Ishino et al. ............ 118/500 |
| 2012/0225537 | A1 | | 9/2012 | Horii |

FOREIGN PATENT DOCUMENTS

| | | |
|---|---|---|
| JP | 2005-317570 A | 11/2005 |
| JP | 2006-013452 A | 1/2006 |
| JP | 2009-029995 A | 2/2009 |
| JP | 2009-054965 A | 3/2009 |
| WO | WO-2012/035880 A1 | 3/2012 |

OTHER PUBLICATIONS

International Search Report and Written Opinion in PCT International Application No. PCT/JP2013/062215, dated Jun. 18, 2013.
Notice of Grounds of Rejection in Japanese Patent Application No. 2012-145080, dated May 31, 2016.
Extended European Search Report in European Patent Application No. 13808514.7, dated Nov. 26, 2015.

* cited by examiner

METHOD FOR MANUFACTURING SEMICONDUCTOR DEVICE

BACKGROUND OF THE INVENTION

Field of the Invention

The present invention relates to a method for manufacturing a semiconductor device, more particularly, a method for manufacturing a semiconductor device so as to achieve reduced contact resistance.

Description of the Background Art

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

Examples of such a semiconductor device employing silicon carbide as its material include a semiconductor device, such as a MOSFET (Metal Oxide Semiconductor Field Effect Transistor), which controls existence/non-existence of an inversion layer in a channel region in accordance with a predetermined threshold voltage so as to conduct and interrupt a current.

In a step in manufacturing a semiconductor device, a semiconductor substrate may be processed with the semiconductor substrate being fixed on an adhesive tape. For example, Japanese Patent Laying-Open No. 2009-29995 discloses a method for manufacturing a semiconductor device by dicing a semiconductor substrate with the semiconductor substrate being fixed by an adhesive tape.

However, when forming an electrode on the semiconductor substrate with the semiconductor substrate being fixed on the adhesive tape, a contact resistance between the semiconductor substrate and the electrode may become large.

SUMMARY OF THE INVENTION

The present invention has been made in view of the foregoing problem, and has its object to provide a method for manufacturing a semiconductor device so as to achieve reduced contact resistance between a semiconductor substrate and an electrode.

The inventor has obtained the following knowledge as a result of diligent study on a cause of a large contact resistance between a semiconductor substrate and an electrode when forming the electrode on the semiconductor substrate with the semiconductor substrate being fixed on the adhesive tape.

Specifically, the temperature of the adhesive tape thus fixing the semiconductor substrate is increased when forming a metal film on the semiconductor substrate through, for example, sputtering or the like with the semiconductor substrate being fixed on the adhesive tape. The increase of the temperature of the adhesive tape causes generation of impurity gas from the adhesive tape, with the result that the metal film formed on the semiconductor substrate is oxidized by the impurity gas. It has been found that when thereafter annealing the metal film to form the electrode, the contact resistance between the semiconductor substrate and the electrode is increased.

Further, it has been found that also in the case where a protecting electrode is formed on the electrode, the impurity gas oxidizes an interface between the electrode and the protecting electrode to presumably result in deteriorated adhesion between the electrode and the protecting electrode. An analysis on components of the impurity gas has shown that the impurity gas is mainly composed of $H_2O$ (water vapor). It is considered that reaction of this $H_2O$ (water vapor) with the metal film causes the oxidation of the metal film.

A method for manufacturing a semiconductor device in the present invention includes the following steps. A semiconductor substrate is prepared which has a first main surface and a second main surface opposite to each other. The semiconductor substrate is fixed on an adhesive tape at the first main surface. The semiconductor substrate fixed on the adhesive tape is placed in an accommodating chamber. A gas is exhausted from the accommodating chamber while maintaining a temperature of the adhesive tape at 100° C. or more. A temperature of the semiconductor substrate is reduced after the step of exhausting the gas from the accommodating chamber. An electrode is formed on the second main surface of the semiconductor substrate after the step of reducing the temperature of the semiconductor substrate. Here, the expression "the semiconductor substrate is fixed on the adhesive tape at the first main surface" is intended to also include a case where the semiconductor substrate is fixed on the adhesive tape with another layer interposed between the first main surface and the adhesive tape.

In the method for manufacturing the semiconductor device in the present invention, the semiconductor substrate fixed on the adhesive tape is placed in the accommodating chamber, and the gas is exhausted from the accommodating chamber while maintaining the temperature of the adhesive tape at 100° C. or more. Accordingly, liquid water contained in or adhered to the adhesive tape is vaporized into water vapor and the water vapor is exhausted from the accommodating chamber, thereby removing the water vapor from the vicinity of the semiconductor substrate. Accordingly, the water vapor can be suppressed from oxidizing the electrode formed on the semiconductor substrate. This results in reduced contact resistance between the semiconductor substrate and the electrode. Also, adhesion between the electrode and the protecting electrode can be improved.

Preferably in the above-described method for manufacturing the semiconductor device, in the step of exhausting the gas from the accommodating chamber, $H_2O$ partial pressure in the accommodating chamber is reduced to $5 \times 10^{-4}$ Pa or less. Accordingly, $H_2O$ in the accommodating chamber can be removed efficiently.

Preferably in the above-described method for manufacturing the semiconductor device, in the step of exhausting the gas from the accommodating chamber, the temperature of the adhesive tape is maintained at not less than 120° C. and not more than 200° C. By maintaining the temperature of the adhesive tape at 120° C. or more, the $H_2O$ in the adhesive tape can be removed more efficiently. By maintaining the adhesive tape at 200° C. or less, change in characteristic of the adhesive tape can be prevented.

Preferably in the above-described method for manufacturing the semiconductor device, in the step of forming the electrode, $H_2O$ partial pressure in the accommodating chamber is reduced to $1\times10^{-4}$ Pa or less. Accordingly, the $H_2O$ in the accommodating chamber can be removed efficiently.

Preferably in the above-described method for manufacturing the semiconductor device, the semiconductor device is a silicon carbide semiconductor device. Accordingly, a silicon carbide semiconductor device having a small contact resistance can be manufactured.

Preferably in the above-described method for manufacturing the semiconductor device, the step of forming the electrode includes the steps of: forming a metal layer on the semiconductor substrate; and annealing the metal layer. Accordingly, the metal layer is alloyed, whereby contact resistance can be reduced between the semiconductor substrate and the electrode.

Preferably in the above-described method for manufacturing the semiconductor device, the step of forming the metal layer is performed using a sputtering method. Accordingly, the metal layer can be fabricated with precision.

Preferably in the above-described method for manufacturing the semiconductor device, in the step of forming the metal layer, the metal layer is formed while cooling the semiconductor substrate. Accordingly, the adhesive tape fixing the semiconductor substrate is cooled, thus suppressing generation of water vapor from the adhesive tape.

Preferably in the above-described method for manufacturing the semiconductor device, the step of forming the metal layer includes the steps of: transporting the semiconductor substrate to a film forming chamber, which is provided to be connected to the accommodating chamber; and forming the metal layer on the semiconductor substrate in the film forming chamber. By separating the film forming chamber from the accommodating chamber, the metal layer can be more securely suppressed from being oxidized by $H_2O$ generated from the adhesive tape.

Preferably in the above-described method for manufacturing the semiconductor device, in the step of forming the metal layer, the metal layer is formed to have an in-plane film thickness distribution of less than 6%. Accordingly, the metal layer having such a small in-plane film thickness distribution is formed to reduce variation in characteristics, thereby improving yield of devices.

As apparent from the description above, there can be provided a method for manufacturing a semiconductor device so as to achieve reduced contact resistance between a semiconductor substrate and an electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
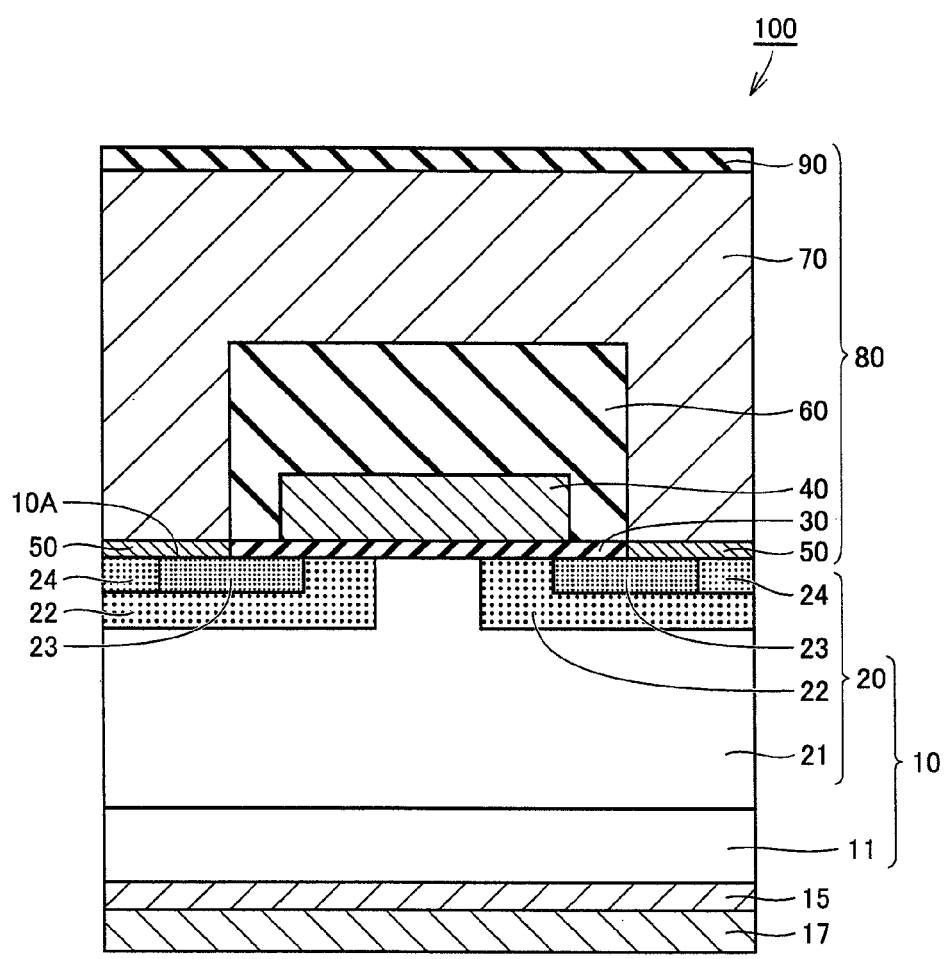
FIG. 1 is a schematic cross sectional view schematically showing a configuration of a semiconductor device according to one embodiment of the present invention.

The following describes an embodiment of the present invention with reference to figures. It should be noted that in the below-mentioned figures, the same or corresponding portions are given the same reference characters and are not described repeatedly.

Described first is an exemplary semiconductor device, which is manufactured using a manufacturing method according to one embodiment of the present invention. The following first describes a configuration of a MOSFET (Metal Oxide Semiconductor Field Effect Transistor) serving as the semiconductor device.

Referring to FIG. 1, MOSFET 100 mainly has a substrate 10 and an electrode portion 80. Substrate 10 has a base substrate 11 and an epitaxial layer 20, for example. Epitaxial layer 20 has a drift region 21, body regions 22, source regions 23, and p+ regions 24.

Base substrate 11 is made of, for example, silicon carbide (SiC) and is a substrate having n type conductivity. Base substrate 11 contains an n type impurity (impurity having n type conductivity) such as N (nitrogen) at a high concentration.

Body region 22 has p type conductivity. The pair of body regions 22 are formed away from each other in drift region 21 so as to include main surface 10A of substrate 10. Examples of the p type impurity contained in each of body regions 22 include Al (aluminum), B (boron), and the like. The p type impurity is contained therein at a concentration lower than that of the n type impurity contained in base substrate 11, for example, at a concentration of $1\times10^{17}$ cm$^{-3}$.

Each of source regions 23 is an n type region having n type conductivity. Source region 23 is formed in and surrounded by each of the pair of body regions 22 so as to include main surface 10A of substrate 10. Source region 23 contains an n type impurity such as P (phosphorus) at a concentration higher than that of the n type impurity contained in drift region 21, for example, at a concentration of $1\times10^{20}$ cm$^{-3}$.

Each of p+ regions 24 is a p type region having p type conductivity. When viewed from source region 23 formed in one of the pair of body regions 22, p+ region 24 is formed at a side opposite to source region 23 formed in the other body region 22, so as to include main surface 10A of substrate 10. P+ region 24 contains a p type impurity such as Al or B, at a concentration higher than that of the p type impurity contained in body region 22, for example, at a concentration of $1\times10^{20}$ cm$^{-3}$.

Electrode portion 80 includes a gate oxide film 30 (insulating film) serving as a gate insulating film, a gate electrode 40, a pair of source electrodes 50 (source contact electrodes), an interlayer insulating film 60, a surface protecting electrode 70, and a passivation film 90.

Gate oxide film 30 is formed on and in contact with main surface 10A of substrate 10 so as to extend from the upper surface of one source region 23 to the upper surface of source region 23. Gate oxide film 30 preferably includes at least one of a silicon oxide film and a silicon nitride film, for example, is made of silicon dioxide (SiO$_2$).

Gate electrode 40 is disposed in contact with gate oxide film 30 so as to extend from a portion over one source region 23 to a portion over the other source region 23. Further, gate electrode 40 is made of a conductor such as polysilicon or Al.

Source electrodes 50 are disposed in contact with main surface 10A of substrate 10, extend from respective portions on the pair of source regions 23 in the directions getting away from gate oxide film 30, and reach portions on p+ regions 24.

Interlayer insulating film 60 is provided in contact with gate electrode 40 and gate oxide film 30. Interlayer insulating film 60 electrically insulates gate electrode 40 and each of source electrodes 50 from each other.

Surface protecting electrode 70 is formed in contact with source electrode 50, and is made of a conductor such as Al. Further, surface protecting electrode 70 is electrically connected to source region 23 via source electrode 50.

Passivation film 90 is formed to extend over gate electrode 40 from one side of surface protecting electrode 70 to the other side of surface protecting electrode 70. This passivation film 90 is made of, for example, SiO$_2$, and has a function of electrically insulating surface protecting electrode 70 and gate electrode 40 from outside and a function of protecting MOSFET 100.

Further, MOSFET 100 includes a drain electrode 15, and a backside surface protecting electrode 17.

Drain electrode 15 is formed in contact with the other main surface of base substrate 11 opposite to the one main surface thereof on which drift region 21 is formed. This drain electrode 15 may be made of a material capable of ohmic contact with base substrate 11, such as NiSi (nickel silicon) or other materials. In this way, drain electrode 15 is electrically connected to base substrate 11.

Backside surface protecting electrode 17 is formed in contact with the main surface of drain electrode 15 opposite to base substrate 11. Backside surface protecting electrode 17 has a stack structure including a Ti layer, a Pt layer, and a Au layer, for example.

Figure 2:
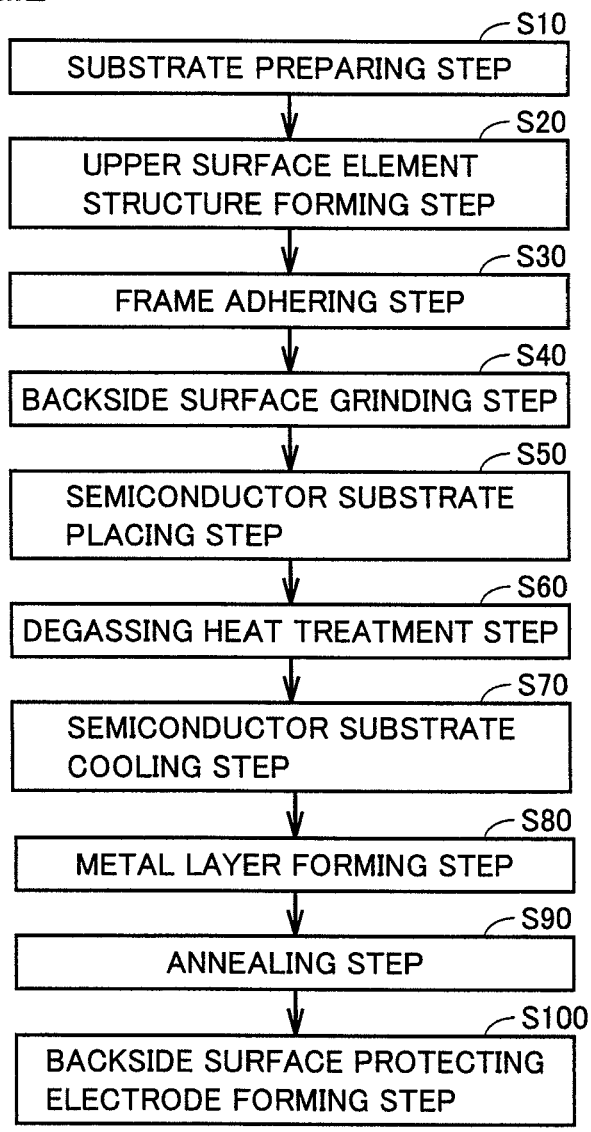
FIG. 2 is a flowchart schematically showing a method for manufacturing the semiconductor device in the embodiment of the present invention.
Figure 3:
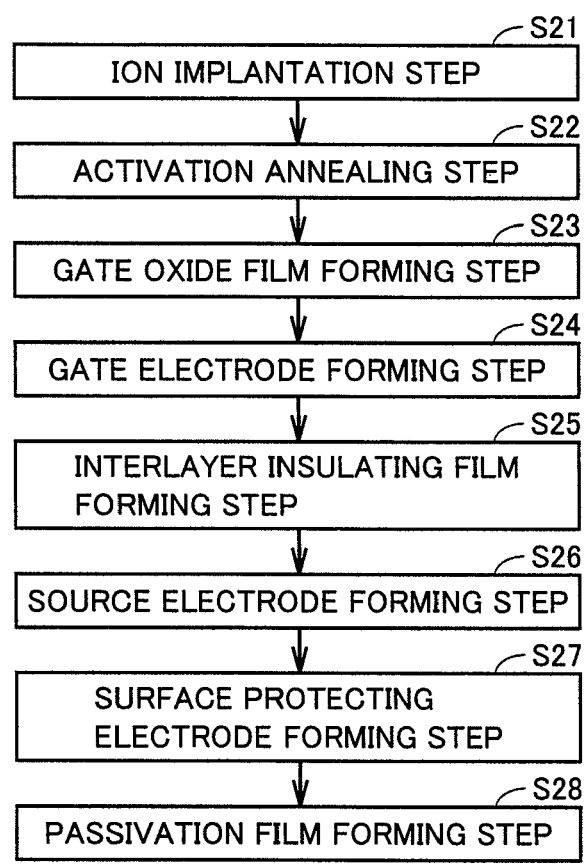
FIG. 3 is a flowchart schematically showing the method for manufacturing the semiconductor device in the embodiment of the present invention.

The following describes a method for manufacturing the semiconductor device in the embodiment of the present invention with reference to FIG. 2 and FIG. 3.

Figure 4:
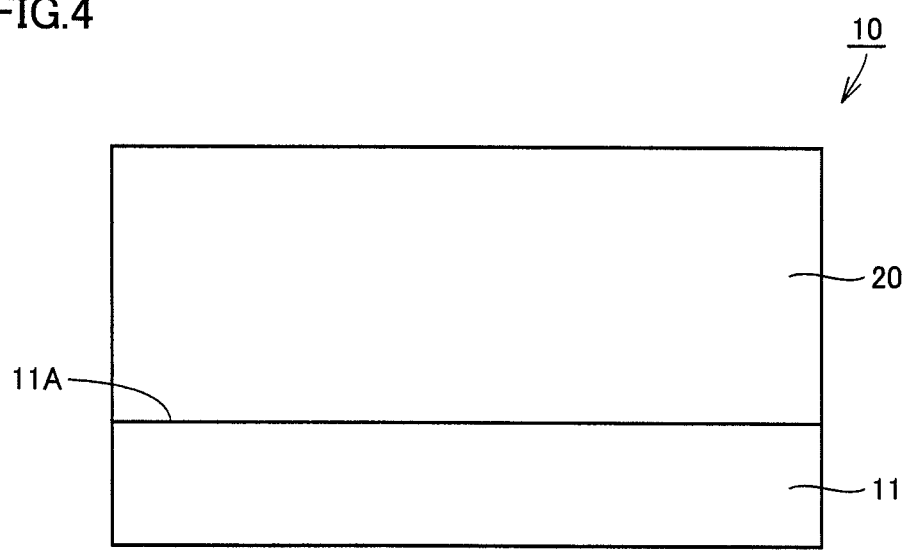
FIG. 4 is a schematic cross sectional view for schematically illustrating a first step of the method for manufacturing the semiconductor device in the embodiment of the present invention.

Referring to FIG. 4, first, as a step (S10: FIG. 2), a substrate preparing step is performed. First, a base substrate preparing step is performed. In this step, an ingot (not shown) made of, for example, 4H—SiC is sliced to prepare base substrate 11 made of silicon carbide and having n type conductivity (first conductivity type).

Next, an epitaxial layer forming step is performed. In this step, on main surface 11A of base substrate 11, for example, epitaxial layer 20 made of silicon carbide and having n type conductivity is formed by means of epitaxial growth.

Figure 10:
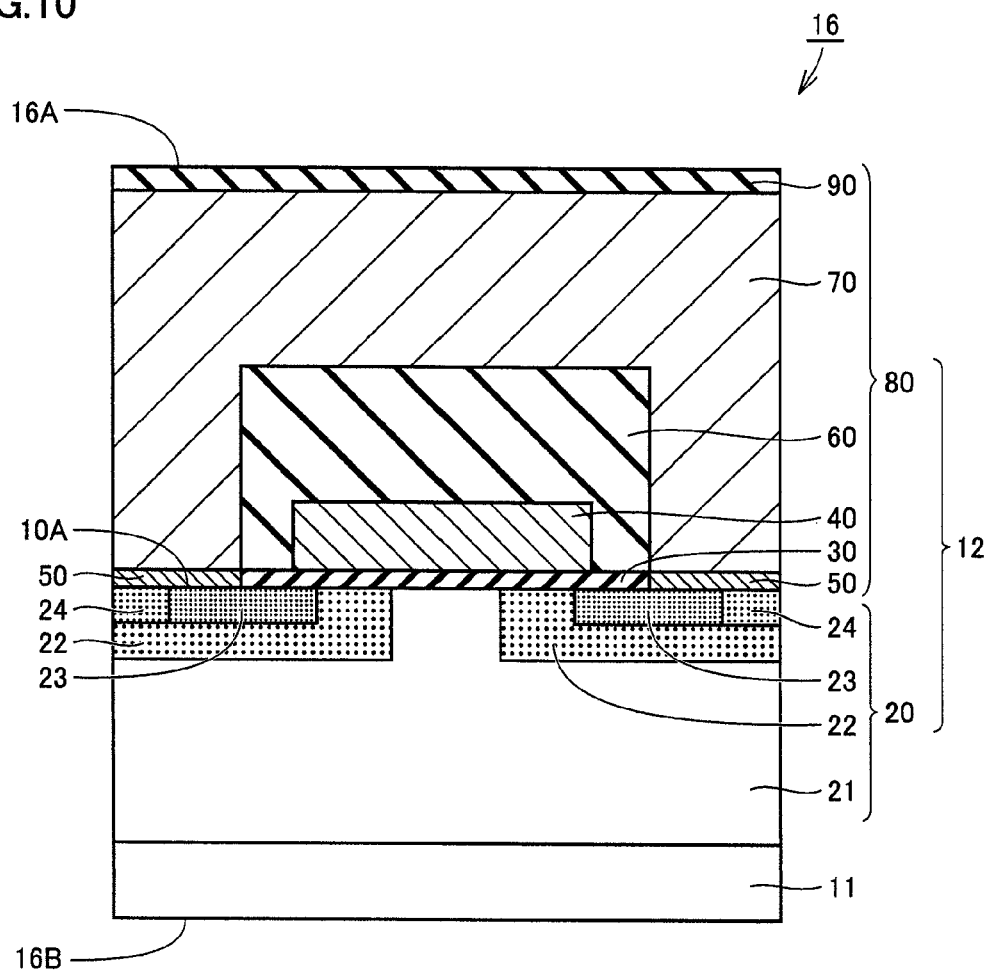
FIG. 10 is a schematic cross sectional view for schematically illustrating a seventh step of the method for manufacturing the semiconductor device in the embodiment of the present invention.

Next, as a step (S20: FIG. 2), an upper surface element structure forming step is performed. In this step (S20: FIG. 2), a step (S21: FIG. 3) to a step (S28: FIG. 3) described below are performed to prepare an intermediate semiconductor substrate 16 (see FIG. 10) in which an upper surface element structure 12 is formed on base substrate 11.

Figure 5:
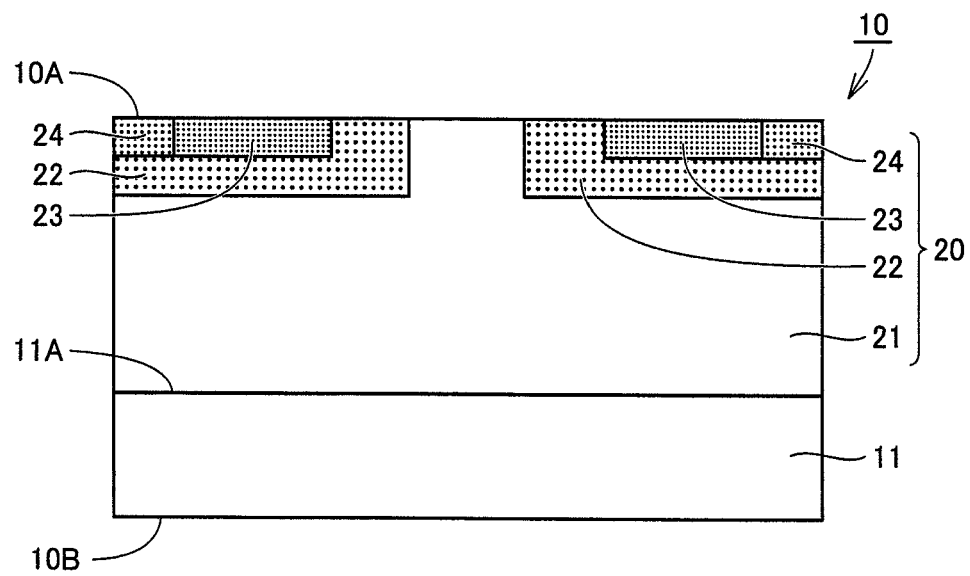
FIG. 5 is a schematic cross sectional view for schematically illustrating a second step of the method for manufacturing the semiconductor device in the embodiment of the present invention.

First, as step (S21: FIG. 3), an ion implantation step is performed. In this step (S21: FIG. 3), referring to FIG. 5, for example, Al (aluminum) ions are first implanted into regions including main surface 10A of substrate 10, thereby forming body regions 22 of p type conductivity (second conductivity type) in epitaxial layer 20. Next, for example, P (phosphorus) ions are implanted into each of body regions 22 at a depth shallower than the depth in which the Al ions have been implanted, thereby forming source region 23 of n type conductivity. Then, for example, Al ions are further implanted into body region 22, thereby forming p+ region 24 adjacent to source region 23, having the same depth as that of source region 23, and having p type conductivity. Further, in epitaxial layer 20, a region in which none of body region 22, source region 23, and p+ region 24 is formed serves as drift region 21.

Next, as step (S22: FIG. 3), an activation annealing step is performed. In this step (S22: FIG. 3), by heating substrate 10, the impurities implanted in the foregoing step (S21: FIG. 3) are activated. Accordingly, desired carriers are generated in the regions having the impurities implanted therein.

Figure 6:
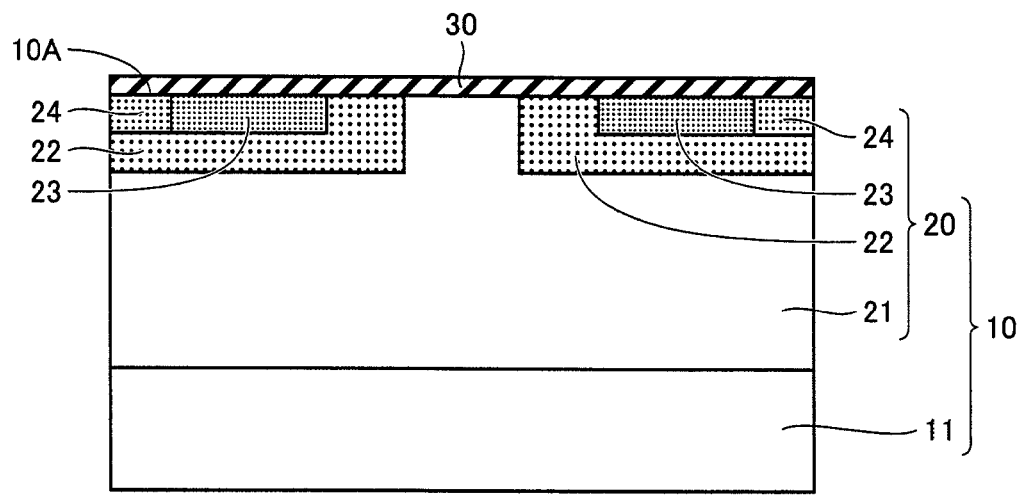
FIG. 6 is a schematic cross sectional view for schematically illustrating a third step of the method for manufacturing the semiconductor device in the embodiment of the present invention.

Next, as step (S23: FIG. 3), a gate oxide film forming step is performed. In this step (S23: FIG. 3), referring to FIG. 6, for example, by heating substrate 10 in an atmosphere containing oxygen, gate oxide film 30 made of SiO$_2$ (silicon dioxide) is formed to cover main surface 10A.

Figure 7:
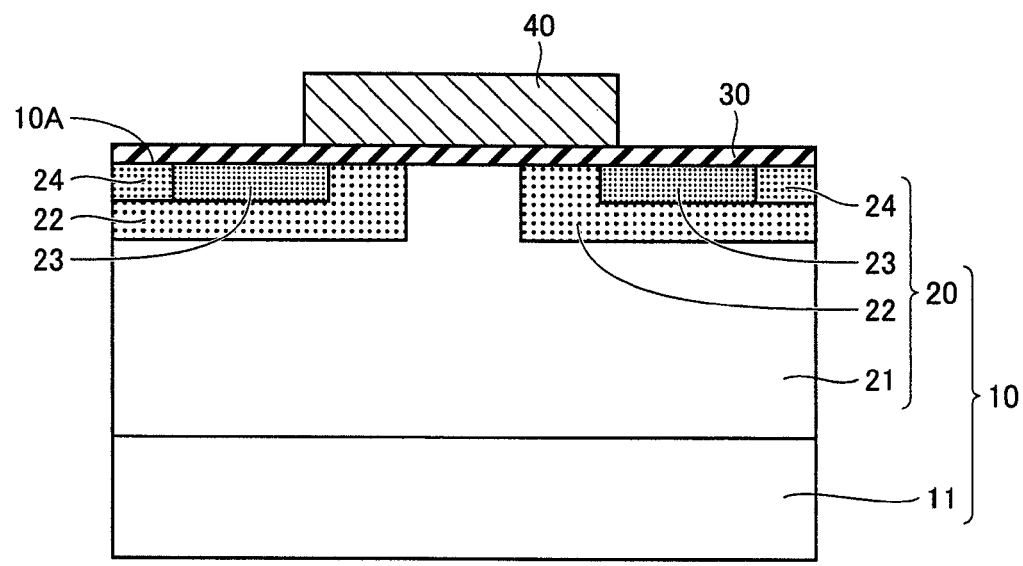
FIG. 7 is a schematic cross sectional view for schematically illustrating a fourth step of the method for manufacturing the semiconductor device in the embodiment of the present invention.

Next, as step (S24: FIG. 3), a gate electrode forming step is performed. In this step (S24: FIG. 3), referring to FIG. 7, for example, an LPCVD (Low Pressure Chemical Vapor Deposition) method is employed to form gate electrode 40, which is made of polysilicon containing an impurity, on and in contact with gate oxide film 30.

Figure 8:
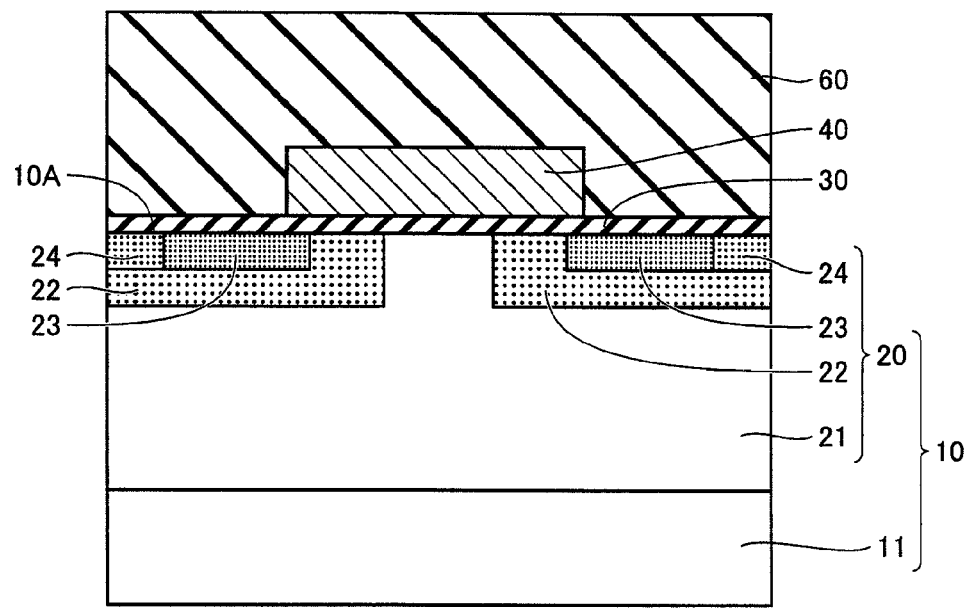
FIG. 8 is a schematic cross sectional view for schematically illustrating a fifth step of the method for manufacturing the semiconductor device in the embodiment of the present invention.

Next, as step (S25: FIG. 3), an interlayer insulating film forming step is performed. In this step (S25: FIG. 3), referring to FIG. 8, for example, a P (Plasma)-CVD method is employed to form interlayer insulating film 60 made of $SiO_2$ so as to cover gate oxide film 30 and gate electrode 40.

Figure 9:
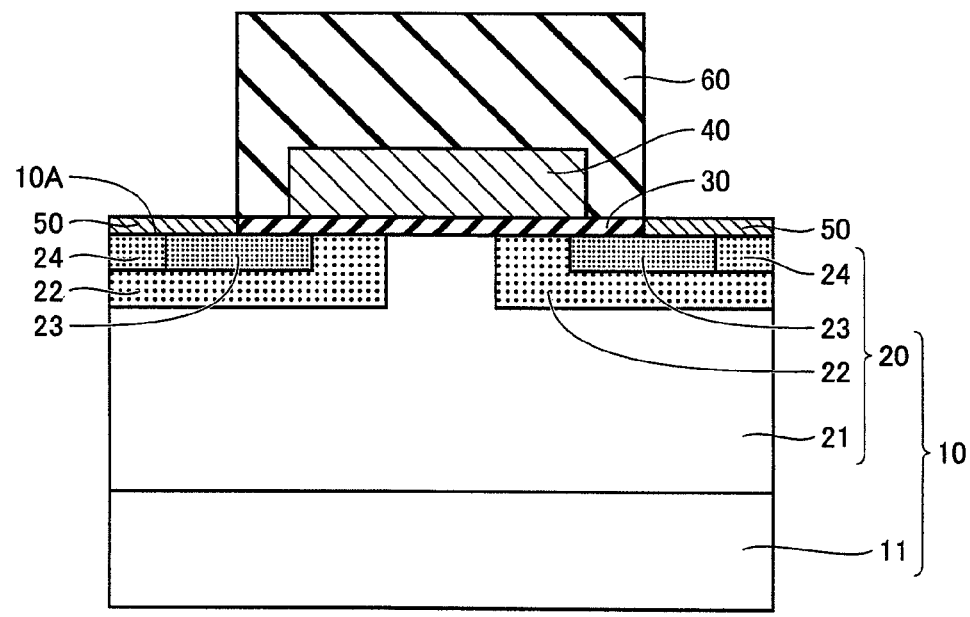
FIG. 9 is a schematic cross sectional view for schematically illustrating a sixth step of the method for manufacturing the semiconductor device in the embodiment of the present invention.

Next, as step (S26: FIG. 3), a source electrode forming step is performed. In this step (S26: FIG. 3), referring to FIG. 9, first, interlayer insulating film 60 and gate oxide film 30 are removed from regions where source electrodes 50 are to be formed, thereby forming regions in which source regions 23 and p+ regions 24 are exposed. Next, for example, sputtering is employed to form a metal layer (not shown) on each of the regions. The metal layer is made of, for example, Ni, NiSi, TiSi, or TiAlSi. Then, the metal layer is heated to silicide at least a portion of the metal layer, thereby forming source electrode 50.

Next, as step (S27: FIG. 3), a surface protecting electrode forming step is performed. In this step (S27: FIG. 3), referring to FIG. 10, surface protecting electrode 70 is formed on and in contact with source electrode 50. Specifically, first, for example, sputtering is employed to form a first electrode layer (not shown), which is made of Ta, TaN, Ti, TiN, or TiW, on and in contact with source electrode 50. Then, a second electrode layer (not shown) made of Al, AlSi, or AlSiCu is formed on the first electrode layer. In this way, surface protecting electrode 70 is formed to have a structure in which the above-described electrode layers are stacked on each other. Alternatively, as the first electrode layer, a first electrode layer may be formed to have a structure in which electrode layers made of Ta and TaN are stacked on each other.

Next, as step (S28: FIG. 3), a passivation film forming step is performed. In this step (S28: FIG. 3), for example, a CVD method is employed to form passivation film 90, which is made of $SiO_2$, so as to cover surface protecting electrode 70.

In this way, intermediate semiconductor substrate 16 is prepared which has first main surface 16A and second main surface 16B opposite to each other.

Figure 11:
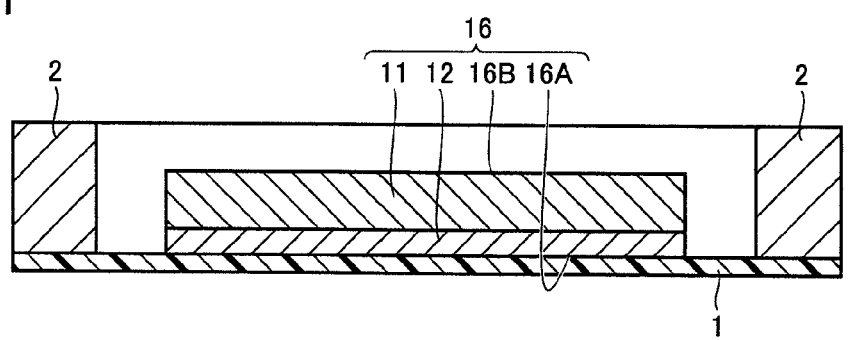
FIG. 11 is a schematic cross sectional view for schematically illustrating an eighth step of the method for manufacturing the semiconductor device in the embodiment of the present invention.
Figure 12:
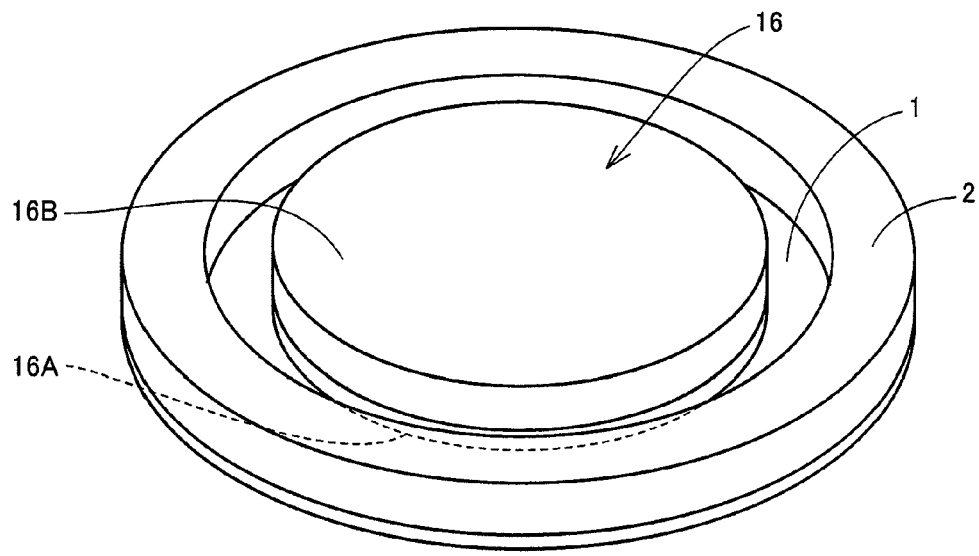
FIG. 12 is a perspective view for schematically illustrating the eighth step of the method for manufacturing the semiconductor device in the embodiment of the present invention.

Next, as a step (S30: FIG. 2), a frame adhering step is performed. In this step (S30: FIG. 2), referring to FIG. 11 and FIG. 12, first main surface 16A of intermediate semiconductor substrate 16 at the upper surface element structure 12 side is put on adhesive tape 1 for adhesion, whereby intermediate semiconductor substrate 16 is supported by adhesive tape 1. Specifically, as shown in FIG. 12, first, an annular ring frame 2 made of a metal is prepared. Next, adhesive tape 1 is set and held at ring frame 2 to close a hole extending through ring frame 2. With adhesive tape 1 being thus held by ring frame 2, adhesive tape 1 is securely provided with surface smoothness. Next, intermediate semiconductor substrate 16 is put on adhesive tape 1 for adhesion such that first main surface 16A at the upper surface element structure 12 side comes into contact with the adhesive surface of adhesive tape 1. As a result, intermediate semiconductor substrate 16, which is thus adhered to adhesive tape 1, is held at a location surrounded by the inner circumference surface of ring frame 2. In this way, intermediate semiconductor substrate 16 is fixed on adhesive tape 1 at first main surface 16A.

It should be noted that adhesive tapes having various configurations can be employed as adhesive tape 1, and an exemplary, usable adhesive tape is one which employs polyester for a base material, employs an acrylic adhesive agent for an adhesive agent, and employs a polyester for a separator. Further, $H_2O$ molecules may be contained or adsorbed in the adhesive tape. Preferably used as adhesive tape 1 is a tape having an adhesive strength decreased when irradiated with an energy ray such as an ultraviolet ray. An ultraviolet-setting resin is an exemplary material having an adhesive strength decreased when irradiated with an energy ray such as an ultraviolet ray. Alternatively, as adhesive tape 1, there may be used a tape having an adhesive strength decreased when being heated. A thermosetting resin is an exemplary material having an adhesive strength decreased when being heated.

Figure 13:
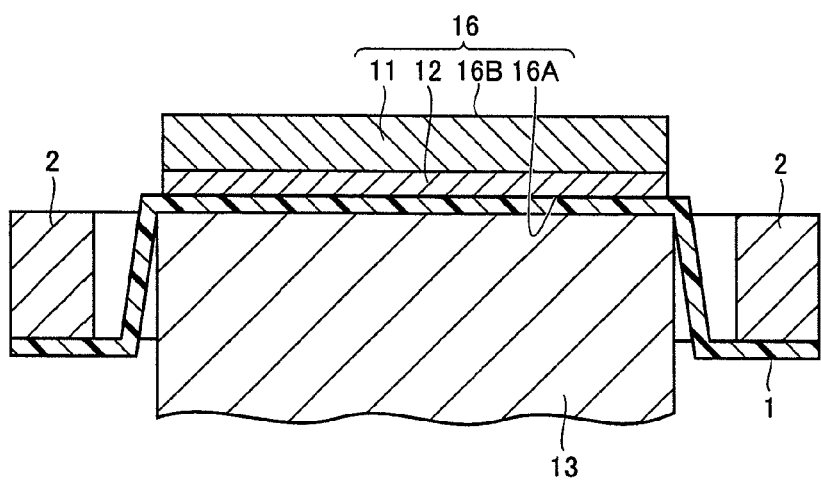
FIG. 13 is a schematic cross sectional view for schematically illustrating a ninth step of the method for manufacturing the semiconductor device in the embodiment of the present invention.
Figure 14:
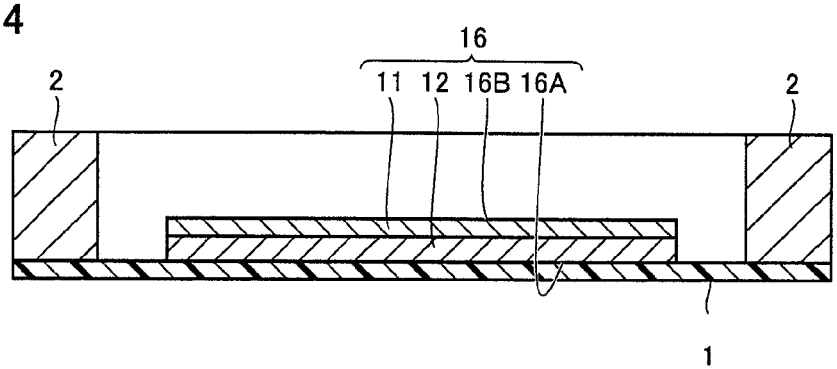
FIG. 14 is a schematic cross sectional view for schematically illustrating a tenth step of the method for manufacturing the semiconductor device in the embodiment of the present invention.

Next, as a step (S40: FIG. 2), a backside surface grinding step is performed. In this step (40: FIG. 2), while intermediate semiconductor substrate 16 is being supported by adhesive tape 1, second main surface 16B of intermediate semiconductor substrate 16 at the base substrate 11 side is grinded. Specifically, referring to FIG. 13, the main surface of adhesive tape 1 opposite to its side holding intermediate semiconductor substrate 16 is first pressed by a pressing member 13 in the axial direction of ring frame 2. Accordingly, adhesive tape 1 is elastically deformed, whereby at least second main surface 16B of intermediate semiconductor substrate 16 held by adhesive tape 1 is deviated from the location surrounded by the inner circumference surface of ring frame 2. Then, second main surface 16B of intermediate semiconductor substrate 16 is pushed against a grinding surface of a grinding device such as a grinder (not shown) so as to grind base substrate 11, with the result that intermediate semiconductor substrate 16 is thinned to a desired thickness as shown in FIG. 14.

Next, a tape replacing step may be performed. In this step, adhesive tape 1 is replaced after completing the above-described step (S40) and finishing the pressing of adhesive tape 1 by pressing member 13. A defect resulting from damage on adhesive tape 1 can be avoided in advance by replacing adhesive tape 1, which might be damaged in step (S40: FIG. 2) as a result of the elastic deformation or the like.

Next, as a step (S50: FIG. 2), a semiconductor substrate placing step is performed. Specifically, intermediate semiconductor substrate 16 fixed on adhesive tape 1 is placed in accommodating chamber 31. Accommodating chamber 31 is connected to, for example, a vacuum pump, which is provided to be capable of exhausting gas in accommodating chamber 31.

Next, as a step (S60: FIG. 2), a degassing heat treatment step is performed. Specifically, the gas is exhausted from accommodating chamber 31 while heating adhesive tape 1 and intermediate semiconductor substrate 16 to 100° C. or more using a heater, for example. In this way, the gas existing in accommodating chamber 31 is exhausted. Preferably, in this step (S60: FIG. 2), $H_2O$ partial pressure in the accommodating chamber is reduced to $5\times10^{-4}$ Pa or less, more preferably, to $1.5\times10^{-4}$ Pa or less. Further, in this step (S60: FIG. 2), the temperature of each of adhesive tape 1 and intermediate semiconductor substrate 16 is preferably maintained at not less than 120° C. and not more than 200° C. Moreover, in this step (S60: FIG. 2), the temperature of each of adhesive tape 1 and intermediate semiconductor substrate 16 is preferably maintained at not less than 140° C. and not more than 180° C., more preferably, not less than 150° C. and not more than 170° C.

Next, as a step (S70: FIG. 2), a semiconductor substrate cooling step is performed. Specifically, after the step of exhausting the gas from accommodating chamber 31 while maintaining the temperature of each of intermediate semiconductor substrate 16 and adhesive tape 1 at 100° C. or more, the heating of intermediate semiconductor substrate 16 and adhesive tape 1 is stopped and the temperature of each of intermediate semiconductor substrate 16 and adhesive tape 1 is reduced from 100° C. or more to a room temperature. Intermediate semiconductor substrate 16 and adhesive tape 1 may be forcibly cooled by a cooling mechanism (not shown) or may be cooled by natural cooling.

Figure 15:
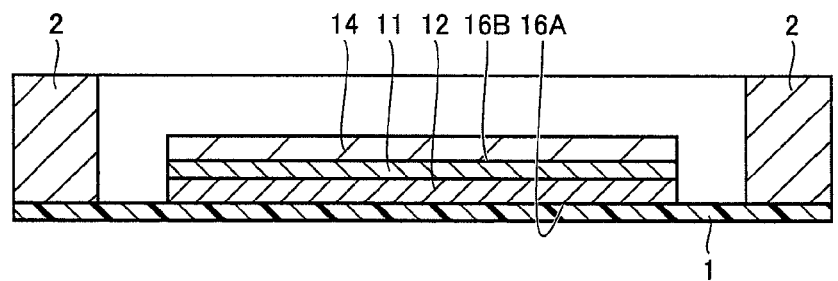
FIG. 15 is a schematic cross sectional view for schematically illustrating an eleventh step of the method for manufacturing the semiconductor device in the embodiment of the present invention.
Figure 18:
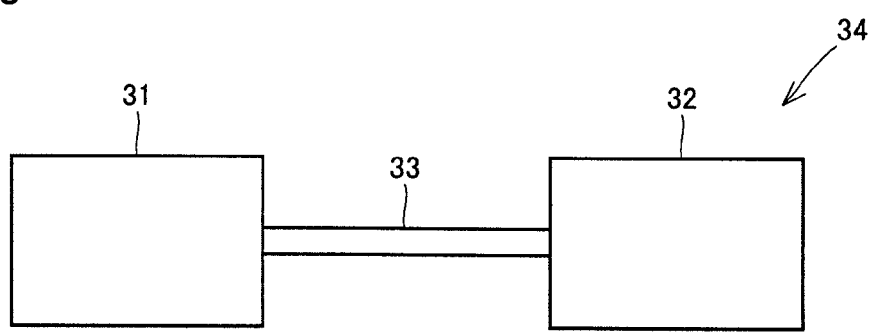
FIG. 18 is a schematic view for schematically illustrating the method for manufacturing the semiconductor device in the embodiment of the present invention.

Next, a backside electrode forming step is performed. The backside electrode forming step includes the steps of: forming metal layer 14 on intermediate semiconductor substrate 16; and annealing metal layer 14. Specifically, first, as a step (S80: FIG. 2), a metal layer forming step is performed. In this step (S80: FIG. 2), referring to FIG. 18, intermediate semiconductor substrate 16 cooled in the above-described step (S70: FIG. 2) is transported from accommodating chamber 31 of film forming device 34 to a film forming chamber 32, which is provided to be connected to accommodating chamber 31 by a connecting portion 33. Intermediate semiconductor substrate 16 is preferably transported from accommodating chamber 31 to film forming chamber 32 via connecting portion 33 with the gas exhausted from accommodating chamber 31, connecting portion 33, and film forming chamber 32. Referring to FIG. 15, in film forming chamber 32, metal layer 14 made of, for example, NiSi is formed on second main surface 16B of intermediate semiconductor substrate 16 with intermediate semiconductor substrate 16 being supported by adhesive tape 1. It should be noted that metal layer 14 is formed after the step of reducing the temperature of intermediate semiconductor substrate 16.

This metal layer 14 may be made of, for example, TiAlSi or the like. Metal layer 14 is preferably formed using the sputtering method. Metal layer 14 may be formed by means of deposition. Metal layer 14 preferably has an in-plane film thickness distribution of less than 6%, more preferably, 5% or less, further preferably 3.5% or less. It should be noted that the term "in-plane film thickness distribution of the metal layer" refers to a percentage value found by dividing a difference between the maximum film thickness of the metal layer and the minimum film thickness of the metal layer by an average film thickness.

In the step of forming the metal layer, metal layer 14 is preferably formed on intermediate semiconductor substrate 16 while cooling intermediate semiconductor substrate 16. Intermediate semiconductor substrate 16 may be cooled using, for example, a cooling mechanism (not shown) making contact with intermediate semiconductor substrate 16.

Figure 16:
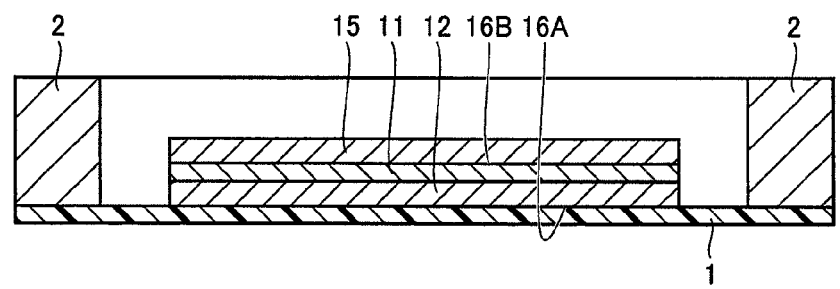
FIG. 16 is a schematic cross sectional view for schematically illustrating a twelfth step of the method for manufacturing the semiconductor device in the embodiment of the present invention.

Next, as a step (S90: FIG. 2), an annealing step is performed. By heating metal layer 14 formed in the above-described step (S80: FIG. 2), metal layer 14 is alloyed into drain electrode 15. Specifically, referring to FIG. 16, for example, metal layer 14 is locally heated through laser irradiation, whereby at least a portion of metal layer 14 is silicided to form drain electrode 15. Drain electrode 15 preferably has an in-plane film thickness distribution of less than 6%, more preferably, 5% or less, further preferably, 3.5% or less. By using the laser irradiation as a method for heating metal layer 14, metal layer 14 can be locally heated more readily while suppressing increase of temperature of a region adjacent to metal layer 14. In this way, drain electrode 15 is formed on second main surface 16B of intermediate semiconductor substrate 16.

Figure 17:
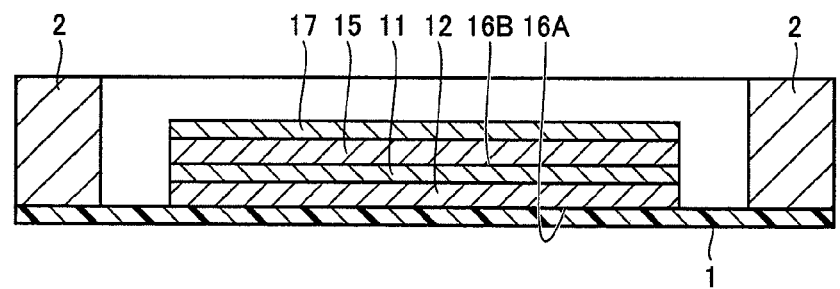
FIG. 17 is a schematic cross sectional view for schematically illustrating a thirteenth step of the method for manufacturing the semiconductor device in the embodiment of the present invention.

Next, as a step (S100: FIG. 2), a backside surface protecting electrode forming step is performed. In this step (S100: FIG. 2), referring to FIG. 17, backside surface protecting electrode 17 is formed on and in contact with drain electrode 15 with intermediate semiconductor substrate 16 being supported by adhesive tape 1. Backside surface protecting electrode 17 is made of, for example, Ti/Pt/Au. Specifically, first, for example, sputtering is employed to form a first electrode layer (not shown), which is made of Ti, TiN, TiW, or NiCr, on and in contact with drain electrode 15. Likewise, sputtering is then employed to form a second electrode layer (not shown), which is made of Pt or Ni, on the first electrode layer. Likewise, sputtering is then employed to form a third electrode layer (not shown), which is made of Au or Ag, on the second electrode layer. In this way, backside surface protecting electrode 17 is formed on drain electrode 15 to have a structure in which the above-described electrode layers are stacked on one another.

Next, a dicing step is performed. In this step, with intermediate semiconductor substrate 16 being supported by adhesive tape 1 adhered to the main surface on which backside surface protecting electrode 17 is formed, intermediate semiconductor substrate 16 is cut in the thickness direction, thus obtaining a plurality of MOSFETs 100. This cutting may be performed by means of laser dicing or scribing, for example. By performing the above-described steps, MOSFET 100 is manufactured, thus completing the method for manufacturing the semiconductor device in the present embodiment.

It should be noted that a MOSFET may be employed which is configured such that n type conductivity and p type conductivity in each of the above-described embodiments are replaced with each other. Further, in the description above, the planar type MOSFET has been illustrated as one example of the semiconductor device of the present invention, but the present invention is not limited to this. For example, the semiconductor device may be, for example, a trench type MOSFET, an IGBT (Insulated Gate Bipolar Transistor), or the like.

Further, in the description above, the silicon carbide substrate is illustrated as the material of substrate 10, but the present invention is not limited to this. Examples of the material of substrate 10 may include Si (silicon), GaAs (gallium arsenide), GaN (gallium nitride), and the like.

The following describes function and effect of the manufacturing method of the present embodiment.

In the method for manufacturing MOSFET 100 in the present embodiment, intermediate semiconductor substrate 16 fixed on adhesive tape 1 is placed in accommodating chamber 31, and the gas is exhausted from accommodating chamber 31 while maintaining the temperature of adhesive tape 1 at 100° C. or more. In other words, pressure in accommodating chamber 31 is made smaller than 1 atmospheric pressure. Accordingly, liquid water contained in or adhered to adhesive tape 1 is vaporized into water vapor and the water vapor is exhausted from accommodating chamber 31, thereby removing the water vapor from the vicinity of intermediate semiconductor substrate 16. Accordingly, the water vapor can be suppressed from oxidizing drain electrode 15 formed on intermediate semiconductor substrate 16. This results in reduced contact resistance between intermediate semiconductor substrate 16 and drain electrode 15. Also, adhesion between drain electrode 15 and backside surface protecting electrode 17 can be improved.

Further, according to the method for manufacturing MOSFET 100 in the present embodiment, in the step of exhausting the gas from accommodating chamber 31, $H_2O$ partial pressure in accommodating chamber 31 is reduced to $5\times10^{-4}$ Pa or less. Accordingly, H$_2$O in accommodating chamber 31 can be removed efficiently.

Further, according to the method for manufacturing MOSFET 100 in the present embodiment, in the step of exhausting the gas from accommodating chamber 31, the temperature of adhesive tape 1 is maintained at not less than 120° C. and not more than 200° C. By maintaining the temperature of adhesive tape 1 at 120° C. or more, the H$_2$O in adhesive tape 1 can be removed efficiently. By maintaining adhesive tape 1 at 200° C. or less, change in characteristic of adhesive tape 1 can be prevented.

Further, according to the method for manufacturing MOSFET 100 in the present embodiment, in the step of forming drain electrode 15, H$_2$O partial pressure in accommodating chamber 31 is reduced to $1\times10^{-4}$ Pa or less. In this way, H$_2$O in accommodating chamber 31 can be removed efficiently.

Further, according to the method for manufacturing MOSFET 100 in the present embodiment, the MOSFET is a silicon carbide MOSFET. Accordingly, a silicon carbide MOSFET having a small contact resistance can be manufactured.

Further, according to the method for manufacturing MOSFET 100 in the present embodiment, the step of forming drain electrode 15 includes the steps of: forming metal layer 14 on intermediate semiconductor substrate 16; and annealing metal layer 14. Accordingly, metal layer 14 is alloyed, whereby contact resistance can be reduced between intermediate semiconductor substrate 16 and drain electrode 15.

Further, according to the method for manufacturing MOSFET 100 in the present embodiment, the step of forming metal layer 14 is performed using the sputtering method. Accordingly, metal layer 14 can be fabricated with precision.

Further, according to the method for manufacturing MOSFET 100 in the present embodiment, in the step of forming metal layer 14, metal layer 14 is formed while cooling intermediate semiconductor substrate 16. Accordingly, adhesive tape 1 fixing intermediate semiconductor substrate 16 is cooled, thus suppressing generation of water vapor from adhesive tape 1.

Further, according to the method for manufacturing MOSFET 100 in the present embodiment, the step of forming metal layer 14 includes the steps of: transporting intermediate semiconductor substrate 16 to film forming chamber 32, which is provided to be connected to accommodating chamber 31; and forming metal layer 14 on intermediate semiconductor substrate 16 in film forming chamber 32. By separating film forming chamber 32 from accommodating chamber 31, metal layer 14 can be more securely suppressed from being oxidized by H$_2$O generated from the adhesive tape.

Further, according to the method for manufacturing MOSFET 100 in the present embodiment, in the step of forming metal layer 14, metal layer 14 is formed to have an in-plane film thickness distribution of less than 6%. Accordingly, metal layer 14 having such a small in-plane film thickness distribution is formed to reduce variation in characteristics, thereby improving yield of devices.

EXAMPLE

The followings were examined in this Example: film thickness distribution of a metal layer 14 (electrode layer) of each of semiconductor devices manufactured using a manufacturing method according to the present invention's example and a manufacturing method according to a comparative example; contact resistance between a backside electrode 15 (NiSi electrode) and a silicon carbide substrate 10; and die shear strength between backside electrode 15 and a backside surface protecting electrode 17.

Explained first are a method for manufacturing a sample according to the present invention's example and a method for manufacturing a sample according to the comparative example. First, a silicon carbide substrate 10 having an semiconductor element formed thereon as described in the embodiment was prepared. Silicon carbide substrate 10 had a thickness of 400 μm and had a diameter of 4 inches. The surface of silicon carbide substrate 10 on which the semiconductor element is formed is adhered to and fixed on adhesive tape 1. By grinding a surface of silicon carbide substrate 10 opposite to its surface adhered to adhesive tape 1, silicon carbide substrate 10 was provided with a thickness of 100 μm.

In the sample according to the present invention's example, silicon carbide substrate 10 fixed on adhesive tape 1 was placed in a heating chamber, and was heated at 120° C. under a condition that H$_2$O partial pressure therein was $5\times10^{-4}$ Pa. The sample according to the comparative example was not subjected to this heating process.

Thereafter, with silicon carbide substrate 10 being kept to be adhered to adhesive tape 1, metal layer 14 was formed using sputtering equipment. Thereafter, with silicon carbide substrate 10 being kept to be adhered to adhesive tape 1, laser annealing was performed to alloy metal layer 14 into backside electrode 15. On this backside electrode 15, backside surface protecting electrode 17 was formed. Backside surface protecting electrode 17 was formed to have a three-layer structure of Ti/Pt/Au. With silicon carbide substrate 10 being kept to be adhered to adhesive tape 1, silicon carbide substrate 10 was diced into chips. A contact resistance between backside electrode 15 and silicon carbide substrate 10 of a device in the form of a chip, and die shear strength between backside electrode 15 and backside surface protecting electrode 17 were measured. In addition, film thickness distribution of metal layer 14 was measured.

The following describes a method for measuring the die shear strength. First, a chip was prepared which was formed through dicing to have a size of 1.5 mm×1.5 mm. With the backside surface protecting electrode 17 side of the chip facing downward, the chip was fixed onto a substrate using a AuSn solder by means of die bonding. With the chip being fixed on the substrate, a shear tool pushes out backside surface protecting electrode 17 in a direction horizontal to the substrate. By measuring the force of pushing out, the die shear strength between backside surface protecting electrode 17 and backside electrode 15 was measured.

TABLE 1

|  | Thickness Distribution of Metal Layer After Film Formation [%] | Contact Resistance of NiSi Electrode [Ωcm$^2$] | Die Shear Strength [kgf] |
| --- | --- | --- | --- |
| Comparative Example | ±6 | $5.0 \times 10^{-3}$ | 1.5 |
| The Present Invention's Example | ±3.5 | $1.5 \times 10^{-5}$ | 10 |

Referring to Table 1, the following describes the film thickness distribution of metal layer 14 (electrode layer), the contact resistance between backside electrode 15 (NiSi electrode) and silicon carbide substrate 10, and the die shear strength between backside electrode 15 and backside surface protecting electrode 17. As shown in Table 1, metal layer 14 of the sample according to the present invention's example had a film thickness distribution of 3.5%, whereas metal layer 14 of the sample according to the comparative example had a film thickness distribution of 6%. In other words, it was confirmed that the film thickness distribution of the metal layer according to the present invention's example was less than 6%. Meanwhile, it was confirmed that the contact resistance between backside electrode 15 and silicon carbide substrate 10 of the sample according to the present invention's example was smaller than the contact resistance between backside electrode 15 and silicon carbide substrate 10 of the sample according to the comparative example. Further, it was confirmed that the die shear strength between backside electrode 15 and backside surface protection electrode 17 of the sample according to the present invention's example was larger than that of backside electrode 15 and backside surface protection electrode 17 of the sample according to the comparative example. Large die shear strength means good adhesion. Hence, it was confirmed that adhesion between backside electrode 15 and backside surface protecting electrode 17 of the sample according to the present invention's example was better than adhesion between backside electrode 15 and backside surface protecting electrode 17 of the sample according to the comparative example.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
    preparing a semiconductor substrate having a first main surface and a second main surface opposite to each other;
    fixing said semiconductor substrate on an adhesive tape at said first main surface;
    after fixing said semiconductor substrate on said adhesive tape, grinding said second main surface of said semiconductor substrate;
    after grinding said second main surface of said semiconductor substrate, placing said semiconductor substrate fixed on said adhesive tape, in an accommodating chamber;
    exhausting a gas from said accommodating chamber while maintaining a temperature of said adhesive tape at 100° C. or more;
    reducing a temperature of said semiconductor substrate after the step of exhausting the gas from said accommodating chamber; and
    forming an electrode on said second main surface of said semiconductor substrate without forming an electrode on said adhesive tape after the step of reducing the temperature of said semiconductor substrate.

2. The method for manufacturing the semiconductor device according to claim 1, wherein in the step of exhausting the gas from said accommodating chamber, $H_2O$ partial pressure in said accommodating chamber is reduced to $5 \times 10^{-4}$ Pa or less.

3. The method for manufacturing the semiconductor device according to claim 1, wherein in the step of exhausting the gas from said accommodating chamber, the temperature of said adhesive tape is maintained at not less than 120° C. and not more than 200° C.

4. The method for manufacturing the semiconductor device according to claim 1, wherein said semiconductor device is a silicon carbide semiconductor device.

5. The method for manufacturing the semiconductor device according to claim 1, wherein the step of forming said electrode includes the steps of: forming a metal layer on said semiconductor substrate; and annealing said metal layer.

6. The method for manufacturing the semiconductor device according to claim 5, wherein in the step of forming said metal layer, $H_2O$ partial pressure in said accommodating chamber is reduced to $1 \times 10^{-4}$ Pa or less.

7. The method for manufacturing the semiconductor device according to claim 5, wherein the step of forming said metal layer is performed using a sputtering method.

8. The method for manufacturing the semiconductor device according to claim 5, wherein in the step of forming said metal layer, said metal layer is formed while cooling said semiconductor substrate.

9. The method for manufacturing the semiconductor device according to claim 5, wherein the step of forming said metal layer includes the steps of: transporting said semiconductor substrate to a film forming chamber, which is provided to be connected to said accommodating chamber; and forming said metal layer on said semiconductor substrate in said film forming chamber.

10. The method for manufacturing the semiconductor device according to claim 5, wherein in the step of forming said metal layer, said metal layer is formed to have an in-plane film thickness distribution of less than 6%.

11. The method for manufacturing the semiconductor device according to claim 1, wherein in the step of reducing the temperature of said semiconductor substrate, said semiconductor substrate is cooled by a cooling mechanism.

12. The method for manufacturing the semiconductor device according to claim 1, wherein in the step of reducing the temperature of said semiconductor substrate, said semiconductor substrate is cooled by natural cooling.

13. The method for manufacturing the semiconductor device according to claim 12, wherein in the step of reducing the temperature of said semiconductor substrate, said semiconductor substrate is cooled to a room temperature.

14. The method for manufacturing the semiconductor device according to claim 1, further comprising the step of replacing said adhesive tape after the step of grinding said second main surface of said semiconductor substrate and before the step of placing said semiconductor substrate in said accommodating chamber.

15. A method for manufacturing a semiconductor device, comprising the steps of:
    preparing a semiconductor substrate having a first main surface and a second main surface opposite to each other;
    preparing a ring frame;
    attaching and holding an adhesive tape on said ring frame;
    fixing said semiconductor substrate on said adhesive tape at said first main surface;
    pressing, by a pressing member, a main surface of said adhesive tape opposite to a side holding said semiconductor substrate in an axial direction of said ring frame;
    after fixing said semiconductor substrate on said adhesive tape, grinding said second main surface of said semiconductor substrate;
    after grinding said second main surface of said semiconductor substrate, placing said semiconductor substrate fixed on said adhesive tape, in an accommodating chamber;

exhausting a gas from said accommodating chamber while maintaining a temperature of said adhesive tape at 100° C. or more;

reducing a temperature of said semiconductor substrate after the step of exhausting the gas from said accommodating chamber; and forming an electrode on said second main surface of said semiconductor substrate after the step of reducing the temperature of said semiconductor substrate, in the step of pressing, by said pressing member, said main surface in the axial direction of said ring frame, said adhesive tape being elastically deformed to deviate said second main surface from a location surrounded by an inner circumference surface of said ring frame.

16. The method for manufacturing the semiconductor device according to claim 15, further comprising the step of replacing said adhesive tape after the step of grinding said second main surface of said semiconductor substrate and before the step of placing said semiconductor substrate in said accommodating chamber.

\* \* \* \* \*